US010693445B1

(12) United States Patent
Liu et al.

(10) Patent No.: US 10,693,445 B1
(45) Date of Patent: Jun. 23, 2020

(54) MAGNETIC TUNNEL JUNCTION RING OSCILLATOR WITH TUNABLE FREQUENCY AND METHODS FOR OPERATING THE SAME

(71) Applicant: Globalfoundries Singapore Pte. Ltd., Singapore (SG)

(72) Inventors: Bin Liu, Singapore (SG); Eng Huat Toh, Singapore (SG)

(73) Assignee: GLOBALFOUNDRIES SINGAPORE PTE. LTD., Singapore (SG)

( * ) Notice: Subject to any disclaimer, the term of this patent is extended or adjusted under 35 U.S.C. 154(b) by 0 days.

(21) Appl. No.: 16/243,433

(22) Filed: Jan. 9, 2019

(51) Int. Cl.
*H03K 3/03* (2006.01)
*H03K 3/45* (2006.01)
*H01F 10/32* (2006.01)
*H01L 43/02* (2006.01)
*H01L 27/22* (2006.01)

(52) U.S. Cl.
CPC ....... *H03K 3/0315* (2013.01); *H01F 10/3254* (2013.01); *H01F 10/3286* (2013.01); *H01L 27/22* (2013.01); *H01L 43/02* (2013.01); *H03K 3/455* (2013.01)

(58) Field of Classification Search
CPC ...... H03K 3/0315; H03K 3/03; H03K 3/0322; H03K 3/455; H03K 3/45; H01F 10/32; H01L 27/22; H01L 43/02
See application file for complete search history.

(56) References Cited

U.S. PATENT DOCUMENTS

| 6,133,799 | A | * | 10/2000 | Favors, Jr. ........ H01L 27/1203 257/E27.112 |
| 6,310,523 | B1 | * | 10/2001 | Chen .................... H03K 3/012 331/108 A |
| 8,081,038 | B2 | | 12/2011 | Lee et al. |
| 9,842,638 | B1 | * | 12/2017 | Li ....................... G11C 11/1697 |
| 2005/0046496 | A1 | | 3/2005 | Singh |
| 2006/0091967 | A1 | | 5/2006 | Iozsef et al. |
| 2008/0231378 | A1 | | 9/2008 | Cong |

OTHER PUBLICATIONS

Choi, et al., Demonstration of a Highly Tunable Hybrid nMOS-Magnetic-Tunnel Junction Ring Oscillator, IEEE Transactions on Electron Devices, Apr. 2016, pp. 1768-1773, vol. 63, No. 4.

* cited by examiner

*Primary Examiner* — Ryan Johnson
(74) *Attorney, Agent, or Firm* — Thompson Hine LLP (57) ABSTRACT

Provided are integrated circuits that include one or more magnetic tunnel junction ring oscillator(s) with tunable frequency and methods for operating the same. Accordingly, an integrated circuit is provided that includes a ring oscillator. The ring oscillator includes an input voltage terminal, an output voltage terminal, and an odd number of at least three inverters disposed electrically in series with one another between the input voltage terminal and the output voltage terminal. Each of the at least three inverters includes an NMOS transistor and one or more magnetic tunnel junctions (MTJs) disposed electrically in series with the NMOS transistor. The NMOS transistor of each of the at least three inverters is selectively tunable with regard to either or both of its threshold voltage and its effective channel width.

14 Claims, 7 Drawing Sheets

MAGNETIC TUNNEL JUNCTION RING OSCILLATOR WITH TUNABLE FREQUENCY AND METHODS FOR OPERATING THE SAME

TECHNICAL FIELD

The technical field generally relates integrated circuits and devices made with integrated circuits, and related methods of operation. More particularly, the technical field relates to integrated circuits that include one or more magnetic tunnel junction ring oscillator(s) with tunable frequency and methods for operating the same.

BACKGROUND

Static random access Phase-Locked Loops (PLLs) are widely used to provide clock signals for integrated circuits in radio, telecommunications, and other applications where a stabilized frequency source or detection of a signal in noise is required. For example, in wireless technology, systems with multiple frequencies are in use, with frequencies in a single system ranging from several hundred megahertz up to a few gigahertz. For compact and power-efficient systems supporting multiple wireless standards, maximum hardware sharing is necessary.

PLLs are closed-loop feedback systems that generate a signal equal in phase and frequency in relation to an input signal. Within the feedback loop of the PLL is a voltage-controlled oscillator (VCO), which generates a signal at a frequency that is a function of the applied bias. Typical designs for VCOs include LC-tank oscillators, crystal oscillators, surface acoustic wave oscillators, and ring oscillators. Of these types of oscillators, only LC-tank oscillators and ring oscillators lend themselves to integration in standard CMOS designs.

While LC-tank oscillators are capable of accurate clock signals, they generally require an off-chip inductor or an on-chip spiral inductor. Integrating a high quality inductor into a standard CMOS process is not trivial, being limited by parasitic effects and the complexity of added non-standard processes. As such, ring oscillators have been found application in a variety of integrated circuits.

Figure 1:
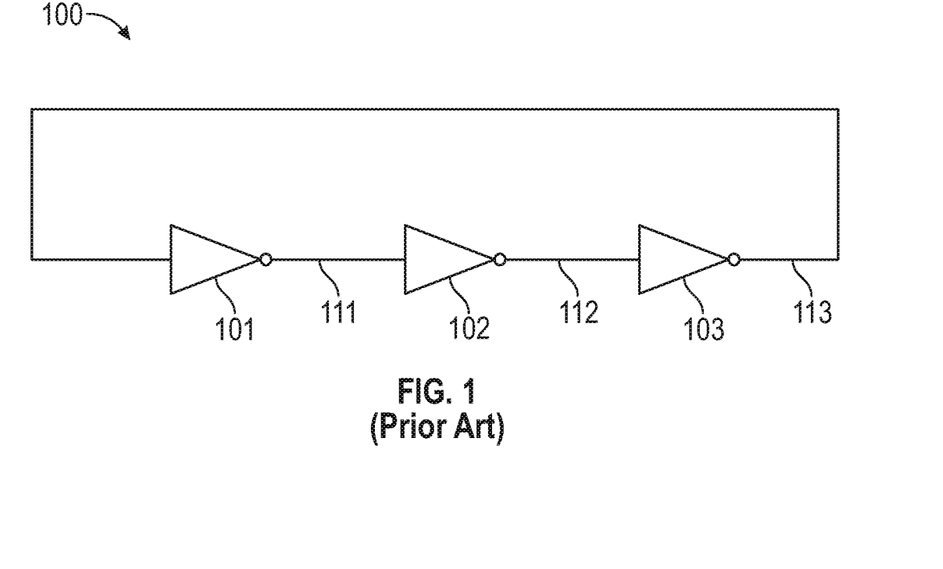
FIG. 1 illustrates the structure and function of a ring oscillator known from the prior art.

FIG. 1 illustrates the basic structure and function of a ring oscillator 100 known from the prior art. Ring oscillator 100 has a structure in which a plurality of delay cells 101, 102, 103 form a loop to generate an oscillation frequency. The delay cells 101, 102, 103 are composed of a series of inverters for inverting and delaying an input signal. The voltage after each delay cell 101, 102, 103 is represented by references numbers 111, 112, 113, respectively. The oscillation frequency of the ring oscillator 100 with such a configuration is variable by delay times of the delay cells 101, 102, 103. The shorter the delay time of the delay cell 101, 102, 103 used in the ring oscillator 100, the higher the oscillation frequency becomes. Conversely, the longer the delay time, the lower the oscillation frequency becomes.

As noted above, for multiple uses within a single device, it is desirable for a ring oscillator to have a wide range of tunable frequencies. This is especially true for battery powered devices that require a high level of power efficiency. Different approaches have been demonstrated in the prior art to achieve various ranges of tunable frequencies. For example, U.S. 2008/0231378 A1 describes a ring oscillator that is tunable by varying the supply voltage to the delay cells of the oscillator. U.S. 2005/0046496 A1 and U.S. Pat. No. 8,081,038 B2 describe ring oscillators that are tunable by varying the load capacitance between delay cells of the oscillator. Choi et al. (IEEE Transactions on Electronic Devices, Vol. 63, Issue 4, April 2016, pp. 1768-73) describe a CMOS ring oscillator that employs a magnetic tunnel junction (MTJ) in place of the PMOS, thereby resulting in one MTJ and one NMOS per inverter of the delay cells of oscillator, wherein frequency is tuned by MTJ state (parallel or anti-parallel).

Yet, the prior art tunable-frequency ring oscillators all require a larger area on the integrated circuit (or "footprint") than is desirable for highly-scaled integrated circuit designs. Thus, it would be desirable to provide tunable-frequency ring oscillators whose circuit elements required for the purposes of tuning occupy a smaller space on the integrated circuit than any solution that has been proposed in the prior art. Moreover, it would be desirable if such tunable-frequency ring oscillators exhibited a broad range of tuning frequencies. Methods for operating such devices within the tunable frequency range would also be desirable. Furthermore, other desirable features and characteristics will become apparent from the subsequent detailed description and the appended claims, taken in conjunction with the accompanying drawings and this background.

BRIEF SUMMARY

Integrated circuits having tunable-frequency ring oscillator(s) and methods of operating the same are provided. In an exemplary embodiment, an integrated circuit is provided that includes a ring oscillator. The ring oscillator includes an input voltage terminal, an output voltage terminal, and an odd number of at least three inverters disposed electrically in series with one another between the input voltage terminal and the output voltage terminal. Each of the at least three inverters includes an NMOS transistor and one or more magnetic tunnel junctions (MTJs) disposed electrically in series with the NMOS transistor. The NMOS transistor of each of the at least three inverters is selectively tunable with regard to either or both of its threshold voltage and its effective channel width.

In another exemplary embodiment, method for operating a ring oscillator formed within an integrated circuit as described in the previous paragraph includes sending a first control signal to at least one of the NMOS transistors to operate at a selected tuning level, with regard to either or both of its threshold voltage and its effective channel width, of a plurality of tuning levels. Alternatively or additionally, the method includes sending a second control signal to at least one of the MTJs to operate at a selected state, either parallel or anti-parallel.

This summary is provided to introduce a selection of concepts in a simplified form that are further described below in the detailed description. This summary is not intended to identify key features or essential features of the claimed subject matter, nor is it intended to be used as an aid in determining the scope of the claimed subject matter.

BRIEF DESCRIPTION OF THE DRAWINGS

The various embodiments will hereinafter be described in conjunction with the following Drawing Figures, wherein like numerals denote like elements, and wherein.

DETAILED DESCRIPTION

The following detailed description is merely exemplary in nature and is not intended to limit the ring oscillator devices or methods for use thereof. Furthermore, there is no intention to be bound by any expressed or implied theory presented in the preceding technical field, background or brief summary, or in the following detailed description.

As set forth in greater detail below, the following description provides frequency-tunable ring oscillators that occupy a relatively small space on an integrated circuit, as compared with prior art implementations. The ring oscillators are configured with an odd number of (but at least three) inverters in series between a voltage input ($V_{IN}$) and a voltage output ($V_{OUT}$) of the ring oscillator. Each inverter includes an NMOS transistor in series with at least one (but possibly more) MTJs. Each NMOS transistor is "tunable" in the sense that the transistor is able to vary its threshold voltage or effective channel width. Further, each MTJ is able to be selected in either the parallel or antiparallel state. The various NMOS tunings in combination with the selectable MTJ state allows for the configuration of a ring oscillator that is tunable to a large number of frequencies within a large range of frequencies. Moreover, limiting the inverters to only one NMOS transistor and only one or more MTJs ensures a relatively small footprint on the integrated circuit. Various embodiments are described in the following paragraphs, with reference to the Figures.

For the sake of brevity, conventional techniques related to conventional device fabrication may not be described in detail herein. Moreover, the various tasks and processes described herein may be incorporated into a more comprehensive procedure or process having additional functionality not described in detail herein. In particular, various techniques in semiconductor fabrication processes are well-known and so, in the interest of brevity, many conventional techniques will only be mentioned briefly herein or will be omitted entirely without providing the well-known process details. Further, it is noted that integrated circuits include a varying number of components and that single components shown in the illustrations may be representative of multiple components.

The drawings are semi-diagrammatic and not to scale and, particularly, some of the dimensions are for the clarity of presentation and are shown exaggerated in the drawings. Similarly, although the views in the drawings for ease of description generally show similar orientations, this depiction in the drawings is arbitrary. Generally, the integrated circuit can be operated in any orientation. Further, spatially relative terms, such as "upper", "over", "lower", "under" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as being "under" other elements or features would then be oriented "above" the other elements or features. Thus, the exemplary term "under" can encompass either an orientation of above or below. The device may be otherwise oriented (rotated 90 degrees or at other orientations) and the spatially relative descriptors used herein may likewise be interpreted accordingly. As used herein, it will be understood that when a first element or layer is referred to as being "over" or "under" a second element or layer, the first element or layer may be directly on the second element or layer, or intervening elements or layers may be present. When a first element or layer is referred to as being "on" a second element or layer, the first element or layer is directly on and in contact with the second element or layer.

Figure 2:
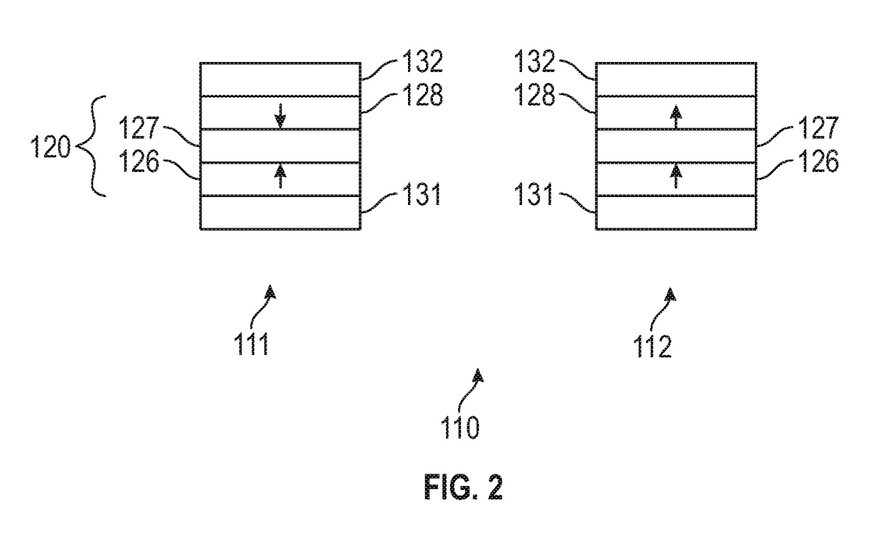
FIG. 2 illustrates the structure and function of a magnetic tunnel junction (MTJ) suitable for use with the tunable-frequency ring oscillators of the present disclosure.

As noted above, the tunable-frequency ring oscillators of the present disclosure employ magnetic tunnel junction structures for purposes of frequency tuning. Accordingly, FIG. 2 shows a simplified cross-sectional view of an embodiment of a magnetic tunnel junction (MTJ) unit 110, which is suitable for use in the tunable-frequency ring oscillators of the present disclosure, in a programmed state 111 and in a programmed state 112. The MTJ unit 110 includes a MTJ stack 120 disposed between a bottom electrode 131 and a top electrode 132. The bottom electrode 131 is proximate to the integrated circuit substrate (not shown) on which the ring oscillator is formed while the top electrode 132 is distal from the substrate.

The exemplary MTJ stack 120 includes a magnetically fixed (pinned) layer or polarizer layer 126, a tunnel barrier layer 127, and a magnetically free layer or storage layer 128. In the illustrated embodiment, the magnetically fixed layer 126 is disposed below the magnetically free layer 128, forming a bottom-pinned MTJ stack 120. The magnetic orientation of fixed layer 126 is fixed in a first perpendicular direction. The term perpendicular direction refers to the direction that is perpendicular to the surface of a substrate or perpendicular to the plane of the layers of the MTJ stack 120. As shown, the first perpendicular direction is in an upward direction away from the substrate. Providing the first perpendicular direction in a downward direction towards the substrate may also be useful in alternative embodiments. The magnetic orientation of free layer 128 may be programmed to be in a first or same direction as fixed layer 126 or in a second or opposite direction as fixed layer 126.

For example, as shown by programmed state 111, the magnetic direction of free layer 128 is programmed to be in the second or anti-parallel direction to fixed layer 126. The corresponding MTJ electrical resistance between free layer 128 and fixed layer 126 in anti-parallel arrangement is denoted as $R_{AP}$. In programmed state 112, the magnetization of free layer 128 is programmed to be in the first or parallel direction to fixed layer 126. The corresponding MTJ electrical resistance between free layer 128 and fixed layer 126 in parallel arrangement is denoted as $R_P$. The resistance $R_{AP}$ is higher than the resistance $R_P$.

Figure 3:
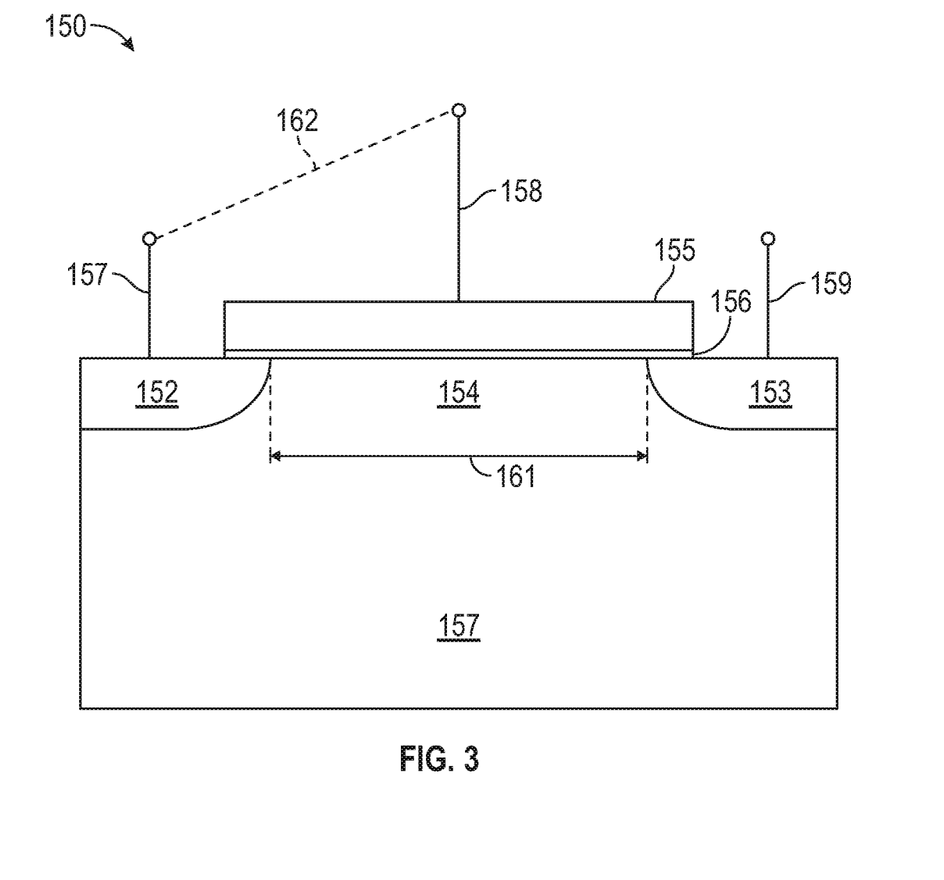
FIG. 3 illustrates the structure and function of a an N-type metal oxide semiconductor (NMOS) transistor with tunable transistor drivability suitable for use with the tunable-frequency ring oscillators of the present disclosure.

As further noted above, the tunable-frequency ring oscillators of the present disclosure employ NMOS transistors with tunable transistor drivability for purposes of frequency tuning. Accordingly, FIG. 3 shows an NMOS transistor 150 disposed on and within semiconductor substrate 151. An exemplary substrate 151 is a semiconductor substrate, such as a silicon substrate. For example, the substrate 151 may be a lightly doped p-type substrate. Providing an intrinsic or other types of doped substrates, such as silicon-germanium (SiGe), germanium (Ge), gallium-arsenic (GaAs) or any other suitable semiconductor materials, may also be useful. In some embodiments, the substrate may be a crystalline-on-insulator (COI) substrate. A COI substrate includes a surface crystalline layer separated from a crystalline bulk by an insulator layer. The insulator layer, for example, may be formed of a dielectric insulating material. The insulator layer, for example, is formed from silicon oxide, which provides a buried oxide (BOX) layer. Other types of dielectric insulating materials may also be useful. The COI substrate, for example, is a silicon-on-insulator (SOI) substrate. For example, the surface and bulk crystalline layers are single crystalline silicon. Other types of COI substrates may also be useful. It is understood that the surface and bulk layers need not be formed of the same material.

The NMOS transistor 150, as shown, includes source and drain regions 152 and 153, respectively, formed in the substrate 151 and a gate 155 disposed on the substrate 151 between the source and drain regions 152 and 152 (with a gate insulating layer 156 being disposed between the substrate 151 and the gate 155. The source and drain regions 152 and 153 are doped with an N-type dopant ion. Additionally, the substrate 151, particularly in the channel region 154 between the source and drain regions 152 and 153, may be lightly doped with a P-type dopant ion. Voltage between the source and drain 152 and 153 may be applied using terminals 157 and 159, respectively. Moreover, terminal 158 is provided for purposes of applying a voltage at the gate 155.

The NMOS transistor 150 has a tunable transistor drivability, that is, the voltage required to drive a given amount of current through channel region 154 between the source and drain regions 152 and 153. For purposes of tuning, either the threshold voltage ($V_t$, represented by dashed line 162 between source terminal 157 and gate terminal 158, and indicating the minimum voltage between these two terminals to allow current to flow through channel region 154) may be varied or the effective channel width (represented by width 161, and indicating the amount of resistance that the current faces when passing through channel region 154) may be varied. Threshold voltage may be varied by any methods known in the art. In a non-limiting embodiment, threshold voltage may be varied by changing the channel doping concentration, i.e. $V_t$ implant, and/or halo/pocket implants. In another non-limiting embodiment, threshold voltage may be varied by changing the gate metal work function. In another non-limiting embodiment, threshold voltage may be varied by controlling the substrate bias. Furthermore, effective channel width may be varied by activating different number of NMOS transistors of the circuits. For any method of operation, either or both of the threshold voltage and the effective channel width may be varied to achieve a desired tuning of the NMOS transistor 150.

Figure 4:
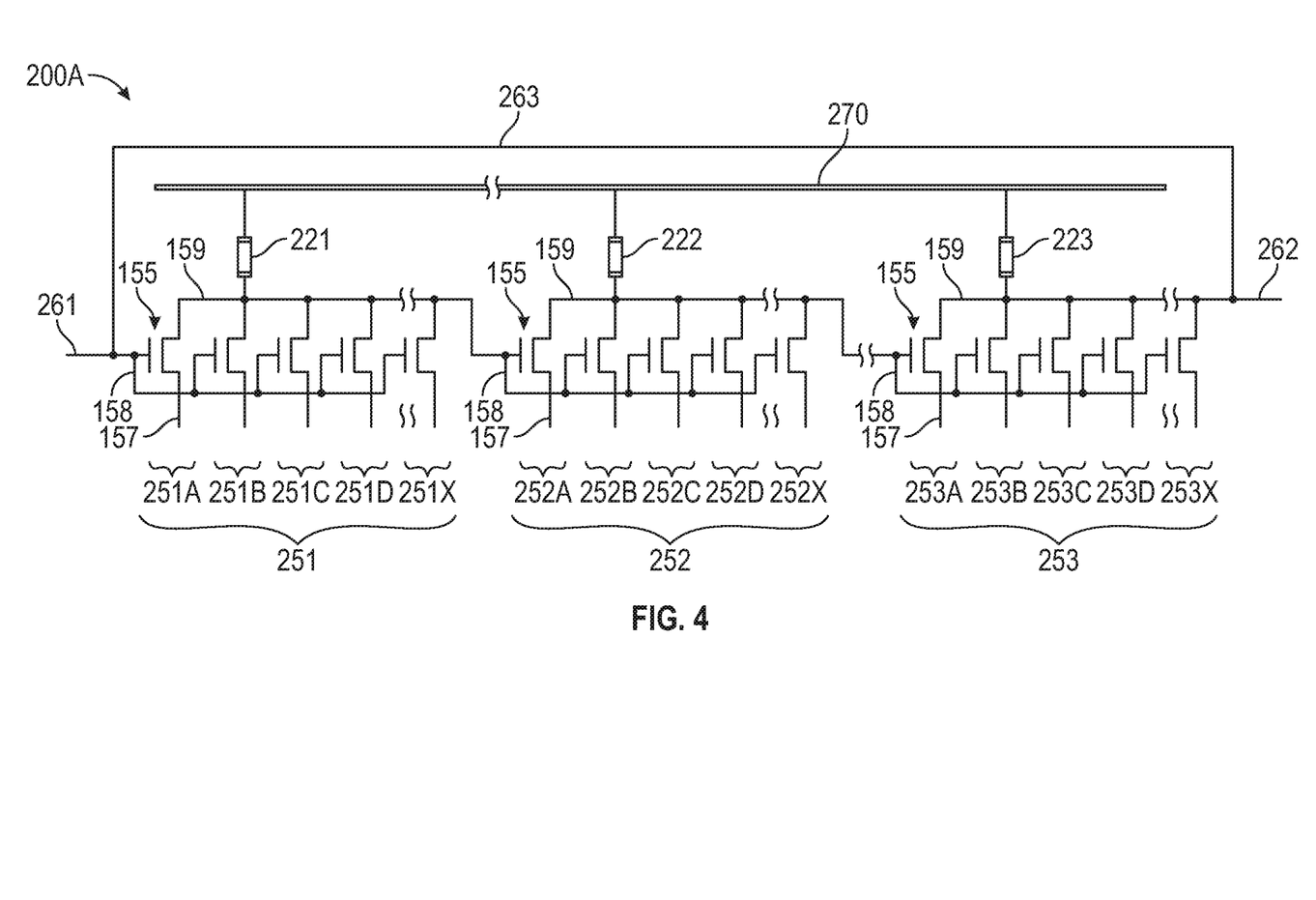
FIG. 4 illustrates a circuit layout for a tunable-frequency ring oscillator for an integrated circuit in accordance with a first embodiment of the present disclosure.

FIG. 4 illustrates a circuit layout for a tunable-frequency ring oscillator 200A for an integrated circuit in accordance with a first embodiment of the present disclosure. Ring oscillator 200A includes an input voltage terminal 261 and an output voltage terminal 262. Disposed in between the input voltage terminal 261 and an output voltage terminal 262, and electrically in series with one another are at least three inverters 251, 252, 253 (if more than three, the inverters are provided in an odd number, such as five, seven, nine, eleven, etc.). Ring oscillator 200A operates in a "closed-loop" manner, and as such conductive line 263 is provided in between the input voltage terminal 261 and an output voltage terminal 262, but electrically in parallel with the at least three inverters 251, 252, 253.

Each of the at least three inverters 251, 252, 253 includes a tunable NMOS transistor as described above with regard to FIG. 3 (including source terminal 157, gate terminal 158, and drain terminal 159). For purposes of illustration, because of the different levels of tuning possible, this is shown as each inverter 251, 252, 253 having a plurality of distinct NMOS transistors (for inverter 251: NMOS transistors 251A-251X; for inverter 252: NMOS transistors 252A-252X; for inverter 253: NMOS transistors 253A-253X). The transistors in one inverter are with different threshold voltages. Only one transistor is active or "on" at a selected tuning level, A-X. The number represented by "X" in each instance is a design consideration that will depend on that particular application, such as the desired frequency range and the number of discrete frequencies possible within that range. The threshold voltage of each NMOS transistor in one inverter is different. Only one transistor will be activated, depending on the desired operating frequency. Each inverter 251, 252, 253 has its own (non-illustrated) source line coupled to the source terminal 157 of each NMOS transistor (251A-X, 252A-X, 253A-X).

Each of the at least three inverters 251, 252, 253 also includes a MTJ 221, 222, 223, respectively. Each MTJ 221, 222, 223 is connected electrically in series with the drain terminal 159 of the NMOS, and a drain voltage ($V_{DD}$) 270 of the ring oscillator 200A. Further frequency tuning of the ring oscillator 200A can thus be accomplished by selecting the respective numbers of MTJs 221, 222, 223 that are in the parallel state and the anti-parallel state. As the MTJ may be considered as replacing the PMOS transistor of a conventional CMOS ring oscillator, it should be appreciated the PMOS transistors may be entirely excluded from the ring oscillator.

Figure 5:
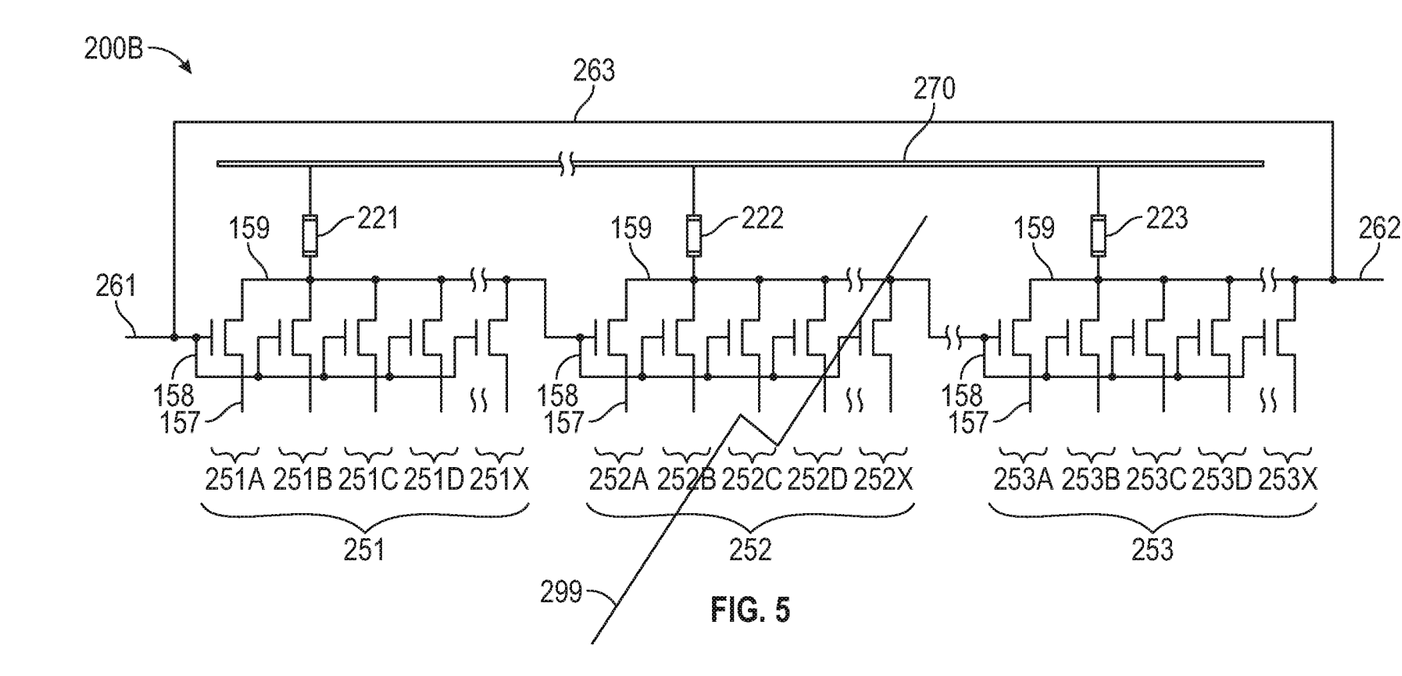
FIG. 5 illustrates a circuit layout for a tunable-frequency ring oscillator for an integrated circuit in accordance with a second embodiment of the present disclosure.

FIG. 5 illustrates a circuit layout for a tunable-frequency ring oscillator 200B for an integrated circuit in accordance with a second embodiment of the present disclosure. All the NMOS transistors in this embodiment are with the same threshold voltage and channel width. This embodiment differs from the first embodiment in that only one of the NMOS in one inverter is active at one time in the first embodiment, while any number of NMOS transistors of one inverter can be active in the second embodiment. Thus, this embodiment different from the first embodiment, wherein it makes use of the number of active NMOS transistors to tune the overall drivability, while the first embodiment uses NMOS with different threshold voltage to change the drivability.

Figure 6:
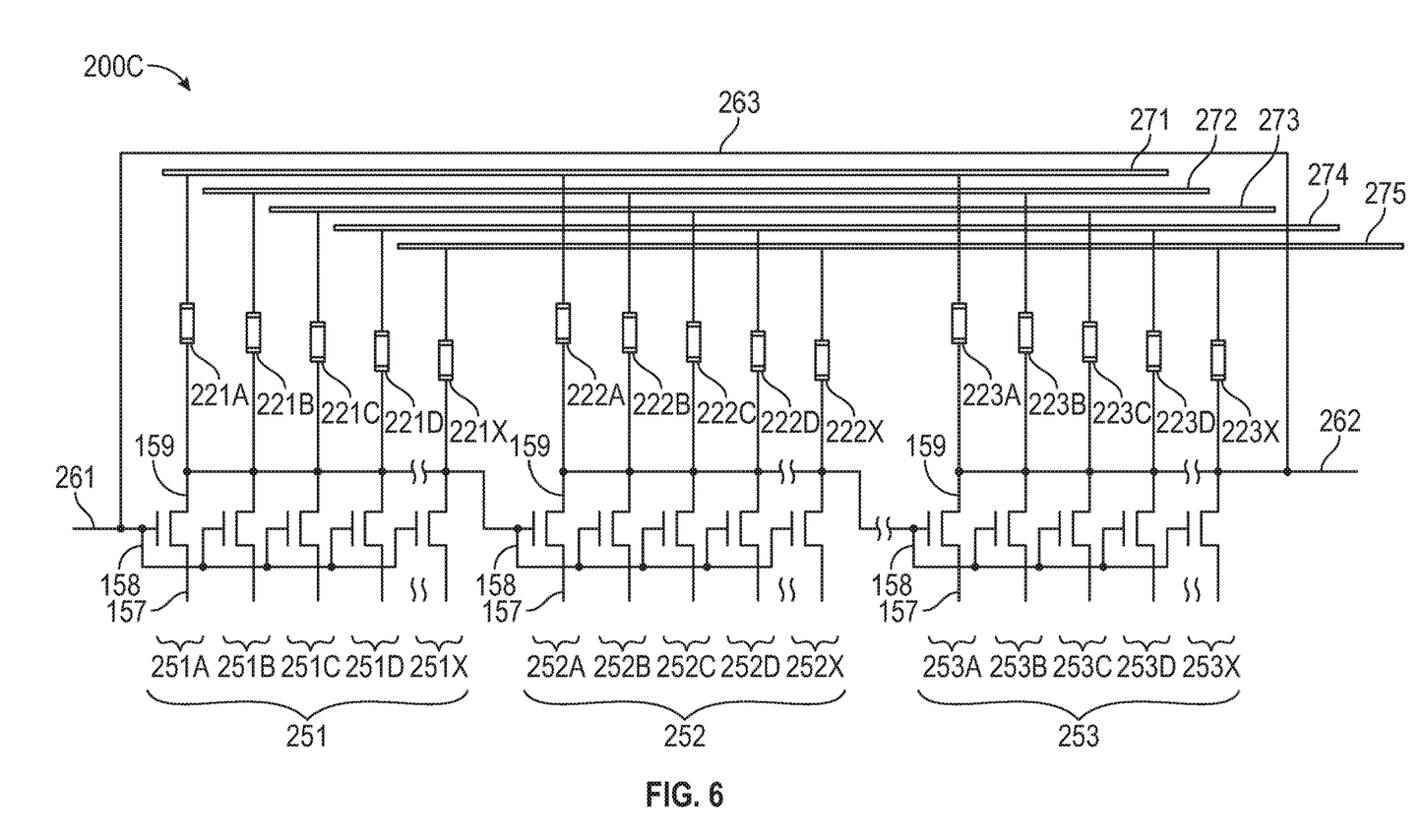
FIG. 6 illustrates a circuit layout for a tunable-frequency ring oscillator for an integrated circuit in accordance with a third embodiment of the present disclosure.

FIG. 6 illustrates a circuit layout for a tunable-frequency ring oscillator 200C for an integrated circuit in accordance with a third embodiment of the present disclosure. The transistors in one inverter are with different threshold voltages. Only one transistor is active or "on" at a selected tuning level, A-X. This embodiment differs from the first embodiment in that each inverter 251, 252, 253 is provided with multiple (physically distinct) MTJs (for inverter 251: MTJs 221A-221X; for inverter 252: MTJs 222A-222X; for inverter 253: MTJs 223A-223X). The number represented by "X" in each instance is a design consideration that will depend on that particular application, such as the desired frequency range and the number of discrete frequencies possible within that range. It should be appreciated that each of the above-described MTJs is separate physical entity of the integrated circuit, and there are indeed "X" MTJs for each inverter 251, 252, 253 (which can vary from inverter to inverter). Of course, the addition of multiple MTJs for each inverter 251, 252, 253 requires a consequent number of additional drain voltages ($V_{DD}$), which are represented in FIG. 6 as voltages 271, 272, 273, 274, and 275 (for example, in the instance where "X" is five). In this embodiment, as with the first, all of the NMOS transistors (251A-X, 252A-X, 253A-X) are assumed active at some level of tuning. The additional MTJs, which optionally can be provided using different materials and dimensions, adds further tunability and frequency range to the ring oscillator 200C.

Figure 7:
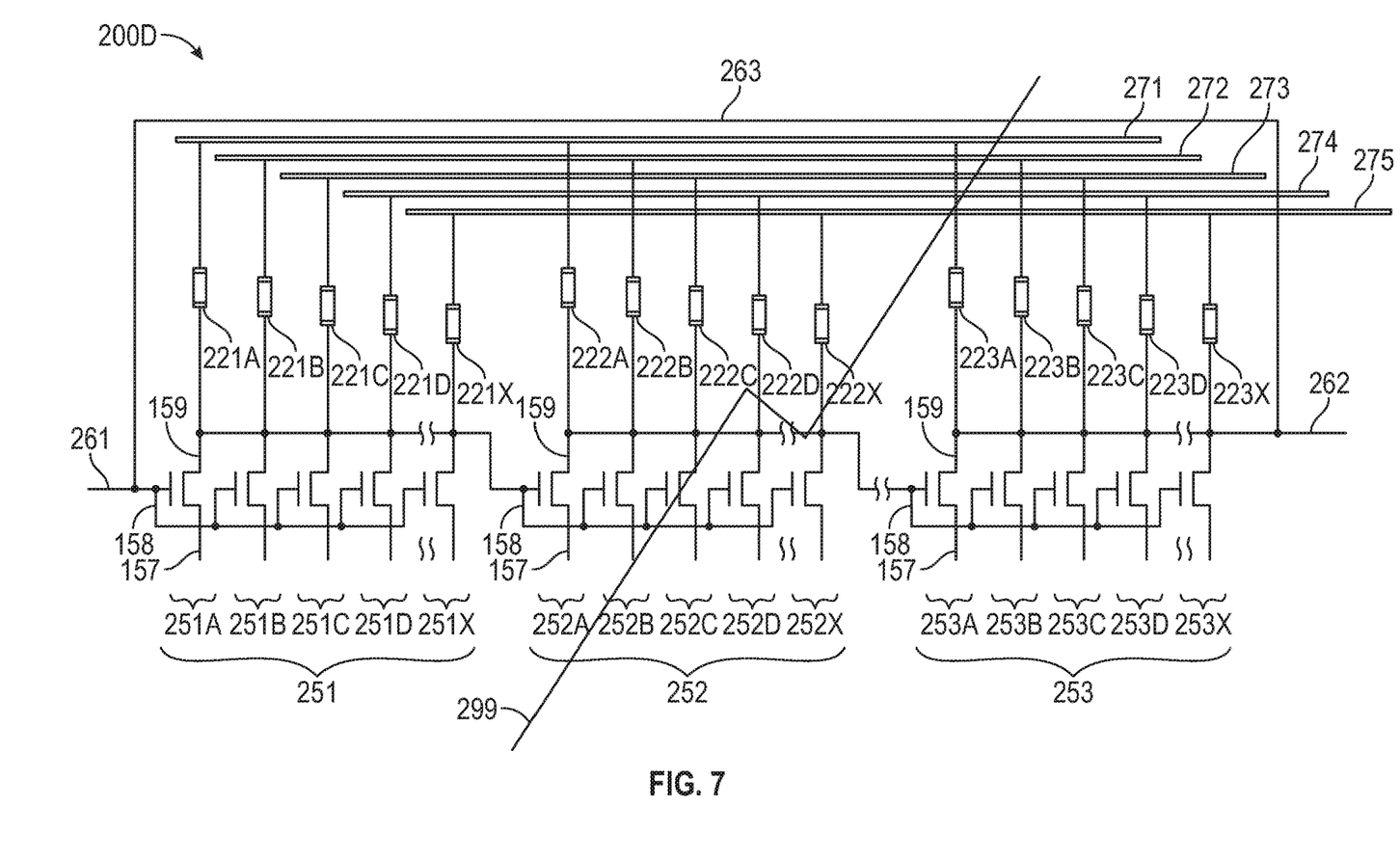
FIG. 7 illustrates a circuit layout for a tunable-frequency ring oscillator for an integrated circuit in accordance with a fourth embodiment of the present disclosure.

FIG. 7 illustrates a circuit layout for a tunable-frequency ring oscillator 200D for an integrated circuit in accordance with a fourth embodiment of the present disclosure. All the NMOS transistors in this embodiment are with the same threshold voltage and channel width. This embodiment differs from the third embodiment in that only one of the NMOS in one inverter is active at one time in the first embodiment, while any number of NMOS transistors of one inverter can be active in the second embodiment. Thus, this embodiment different from the first embodiment, wherein it makes use of the number of active NMOS transistors to tune the overall drivability, while the first embodiment uses NMOS with different threshold voltage to change the drivability. Whether a particular number of NMOS is active (at some tuning level A-X) as in this embodiment is further able to enhance the available range of tuning of the ring oscillator 200D.

Figure 8:
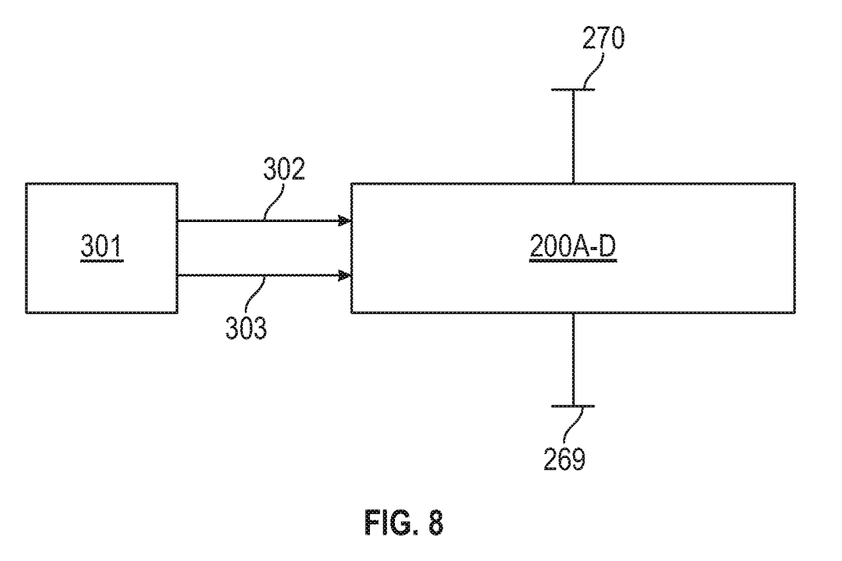
FIG. 8 is a diagram illustrating a method for controlling, at various frequencies, the tunable-frequency ring oscillator of any of the first through fourth embodiments.

FIG. 8 is a diagram illustrating a method for controlling, at various frequencies, the tunable-frequency ring oscillator of any of the first through fourth embodiments (200A-D), using control circuit 301. Control circuit 301 performs two illustrated functions: at 302, determining whether the ring oscillator 200A-D should be enabled (note both source voltage 269 ($V_{SS}$) and drain voltage 270 ($V_{DD}$) are illustrated terminals of the ring oscillator 200A-D in this Figure); and at 303, tuning the NMOS and/or selecting the state of each MTJ, for purposes of selecting a desired frequency within the available range of the ring oscillator 200A-D. For uses where MTJ programming is not required (that is, state selection), $V_{DD}$ 270 may be a constant voltage; alternatively, where MTJ programming is required, $V_{DD}$ 270 may be a variable voltage. A variable $V_{DD}$ may additionally be employed, in some embodiments, for an additional means of frequency tuning.

As such, using the control circuit 301, a method may include sending a first control signal to at least one of the NMOS transistors to operate at a selected tuning level, with regard to either or both of its threshold voltage and its effective channel width, of a plurality of tuning levels; and/or sending a second control signal to at least one of the MTJs to operate at a selected state, either parallel or anti-parallel. Either or both of the first and second control signals may be sent, depending on the desired frequency for tuning the ring oscillator. Additional control signals may be sent, for example to other NMOS transistors (including that it should operate in the inactive or "off" state, as described above) and/or other MTJs.

Thus, the present disclosure has provided provide tunable-frequency ring oscillators whose circuit elements required for the purposes of tuning occupy a smaller space on the integrated circuit than any solution that has been proposed in the prior art. The disclosed tunable-frequency ring oscillators exhibited a broad range of tuning frequencies suitable for use in a wide variety of electronic devices, such as radio, telecommunications, and other applications.

While at least one exemplary embodiment has been presented in the foregoing detailed description, it should be appreciated that a vast number of variations exist. It should also be appreciated that the exemplary embodiment or exemplary embodiments are only examples, and are not intended to limit the scope, applicability, or configuration as claimed in any way. Rather, the foregoing detailed description will provide those skilled in the art with a convenient road map for implementing the exemplary embodiment or exemplary embodiments. It should be understood that various changes can be made in the function and arrangement of elements without departing from the scope herein as set forth in the appended claims and the legal equivalents thereof.

What is claimed is:

1. An integrated circuit comprising:
a ring oscillator, wherein the ring oscillator comprises:
an input voltage terminal;
an output voltage terminal; and
an odd number of at least three inverters disposed electrically in series with one another between the input voltage terminal and the output voltage terminal, each of the at least three inverters comprising a first N-type metal oxide semiconductor transistor, a second N-type metal oxide semiconductor transistor, and one or more magnetic tunnel junctions disposed electrically in series with the first N-type metal oxide semiconductor transistor and electrically in series with the second N-type metal oxide semiconductor transistor,
wherein the first N-type metal oxide semiconductor transistor and the second N-type metal oxide semiconductor transistor of each of the at least three inverters are selectively tunable with regard to either or both of a threshold voltage and an effective channel width.

2. The integrated circuit of claim 1, wherein the first N-type metal oxide semiconductor transistor and the second N-type metal oxide semiconductor transistor of each of the at least three inverters are selectively tunable with regard to the threshold voltage.

3. The integrated circuit of claim 1, wherein the first N-type metal oxide semiconductor transistor and the second N-type metal oxide semiconductor transistor of each of the at least three inverters are selectively tunable with regard to the effective channel width.

4. The integrated circuit of claim 1, wherein the first N-type metal oxide semiconductor transistor and the second N-type metal oxide semiconductor transistor of each of the at least three inverters are selectively tunable with regard to both the threshold voltage and the effective channel width.

5. The integrated circuit of claim 1, wherein each of the at least three inverters is coupled to a voltage source ($V_{SS}$) and a voltage drain of (VDD), and the first N-type metal oxide semiconductor transistor, the second N-type metal oxide semiconductor transistor, and the one or more magnetic tunnel junctions of each of the at least three inverters are disposed electrically in series with one another from the voltage source to the voltage drain.

6. The integrated circuit of claim 1, wherein at least one of the at least three inverters comprises a plurality of magnetic tunnel junctions.

7. The integrated circuit of claim 6, wherein the at least one of the at least three inverters is coupled to a voltage source ($V_{SS}$) and a number of voltage drains (VDD) equivalent in number to the number of magnetic tunnel junctions, wherein each magnetic tunnel junction of the plurality of magnetic tunnel junctions is coupled to a respective voltage drain of the number of voltage drains.

8. The integrated circuit of claim 6, wherein at least one of the magnetic tunnel junctions from the plurality of magnetic tunnel junctions differs from another of the magnetic tunnel junctions from the plurality of magnetic tunnel junctions with regard to materials and/or dimensions.

9. The integrated circuit of claim 1 comprising three or five inverters.

10. The integrated circuit of claim 1, wherein the ring oscillator excludes P-type metal oxide semiconductor transistors.

11. A method of operating a ring oscillator disposed on an integrated circuit, wherein the ring oscillator comprises:
an input voltage terminal;
an output voltage terminal; and
an odd number of at least three inverters disposed electrically in series with one another between the input voltage terminal and the output voltage terminal, each of the at least three inverters comprising an N-type metal oxide semiconductor transistor and one or more magnetic tunnel junctions disposed electrically in series with the N-type metal oxide semiconductor transistor, and the N-type metal oxide semiconductor transistor of each of the at least three inverters selectively tunable with regard to either or both of a threshold voltage and an effective channel width, and
wherein the method comprises:
sending a first control signal to at least one of the N-type metal oxide semiconductor transistors to operate at a selected tuning level, with regard to either or both of the threshold voltage and the effective channel width, of a plurality of tuning levels;
sending a second control signal to at least one of the one or more magnetic tunnel junctions to operate at a selected state, either parallel or anti-parallel; and
sending a third control signal to the N-type metal oxide semiconductor transistor of one of the at least three inverters to operate in an inactive or "off" state.

12. The method of claim 11, wherein the ring oscillator is configured such that at least one of the at least three inverters comprises a plurality of magnetic tunnel junctions, the at least one of the at least three inverters is coupled to a voltage source (Vss) and a number of voltage drains (VDD) equivalent in number to the number of the plurality of magnetic tunnel junctions, and wherein each one or more magnetic tunnel junction of the plurality of magnetic tunnel junctions is coupled to a respective voltage drain of the number of voltage drains, and the method further comprising:
sending a fourth control signal to at least one of the plurality of magnetic tunnel junctions to operate at a selected state, either parallel or anti-parallel, wherein the at least one of the one or more magnetic tunnel junctions and the at least one of the plurality of magnetic tunnel junctions are provided as part of the same inverter of the at least three inverters.

13. The method of claim 11, wherein the first and second signals are sent to a ring oscillator comprising three or five inverters.

14. The method of claim 11, wherein the first and second signals are sent to a ring oscillator excluding P-type metal oxide semiconductor transistors.

* * * * *